United States Patent [19]

Shibata

[11] Patent Number: 5,184,205
[45] Date of Patent: Feb. 2, 1993

[54] SEMICONDUCTOR DEVICE HAVING MULTI-LAYERED WIRING, AND METHOD OF MANUFACTURING THE SAME

[75] Inventor: Hideki Shibata, Yokohama, Japan

[73] Assignee: Kahishiki Kaisha Toshiba, Kawasaki, Japan

[21] Appl. No.: 711,144

[22] Filed: Jun. 6, 1991

[30] Foreign Application Priority Data

Jun. 7, 1990 [JP] Japan ................... 2-147489

[51] Int. Cl.⁵ ............................................. H01L 23/54
[52] U.S. Cl. ..................................... 257/765; 257/757; 257/755
[58] Field of Search ................................ 357/67, 71, 59

[56] References Cited

U.S. PATENT DOCUMENTS 3,888,971  5/1975  Greer et al. .......................... 357/67
4,507,852  4/1985  Karulkar ............................... 357/67
4,937,652  6/1990  Okumura et al. ..................... 387/67
5,081,064  1/1992  Inoue et al. .......................... 357/68

Primary Examiner—Rolf Hille
Assistant Examiner—S. V. Clark
Attorney, Agent, or Firm—Finnegan, Henderson, Farabow, Garrett and Dunner

[57] ABSTRACT

A semiconductor device comprising a substrate, a first metal wiring layer made of aluminum alloy and formed on the substrate, a conductive film made of doped polysilicon and formed on a selected part of the first metal wiring layer, an inter-layer insulation film made of plasma $SiO_2$ and formed on the conductive film and the first metal wiring layer, a contact hole formed in the inter-layer insulation film and being larger than the conductive film, and a second metal wiring layer made of aluminum alloy, extending through the contact hole, and connected to the conductive film.

2 Claims, 5 Drawing Sheets

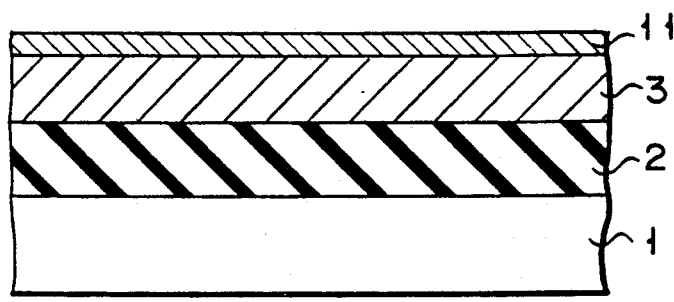
F I G. 2A
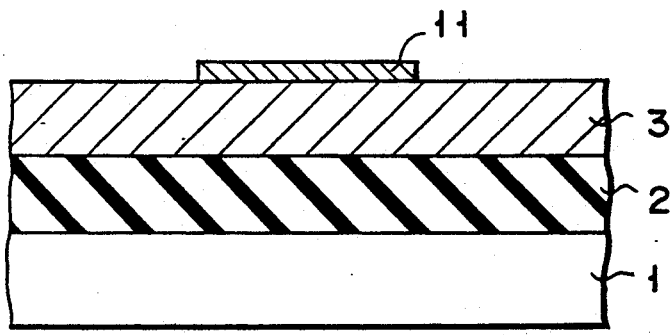
F I G. 2B
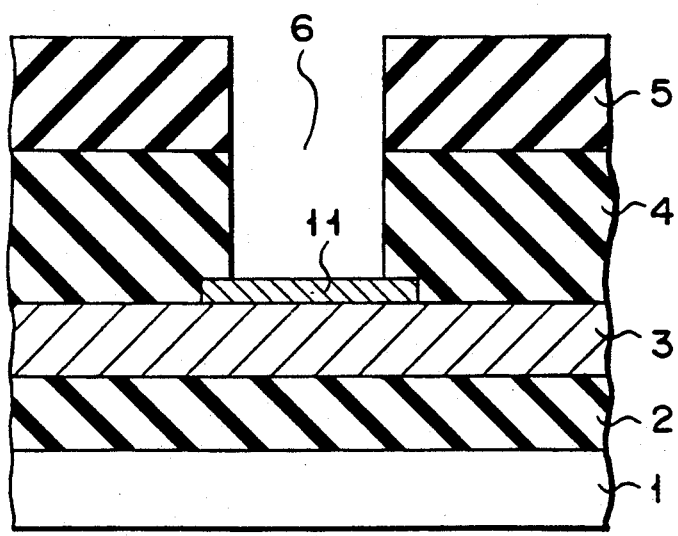
F I G. 2C

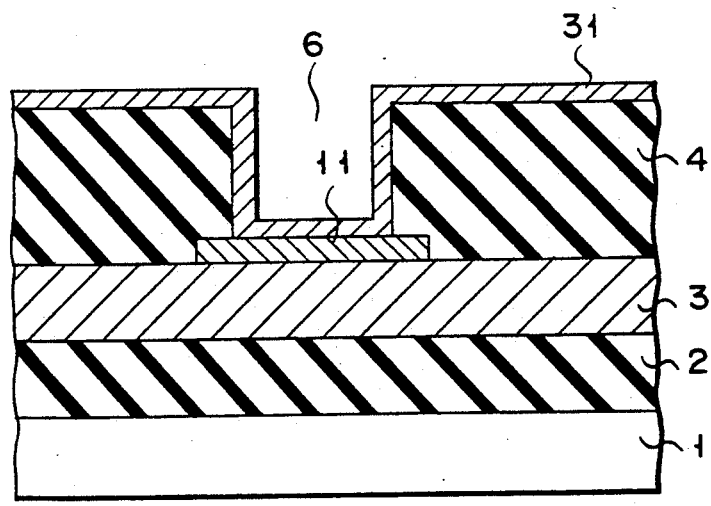
F I G. 5A
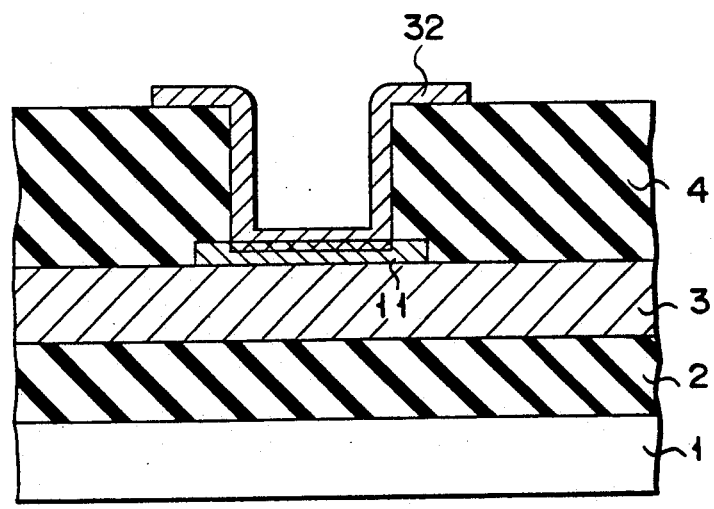
F I G. 5B
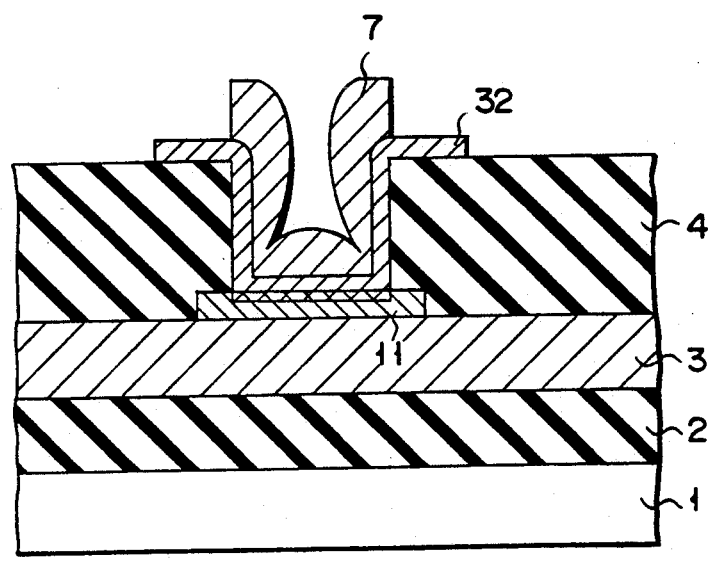
F I G. 5C

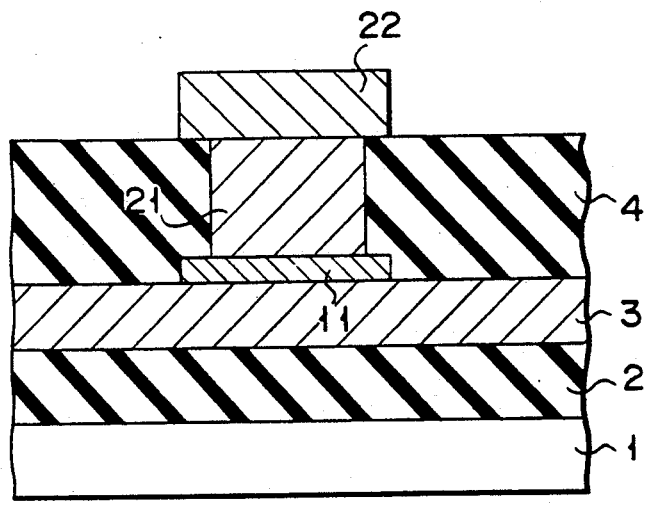
F I G. 4
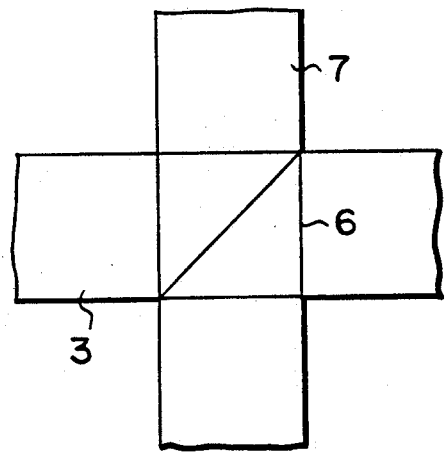
F I G. 6
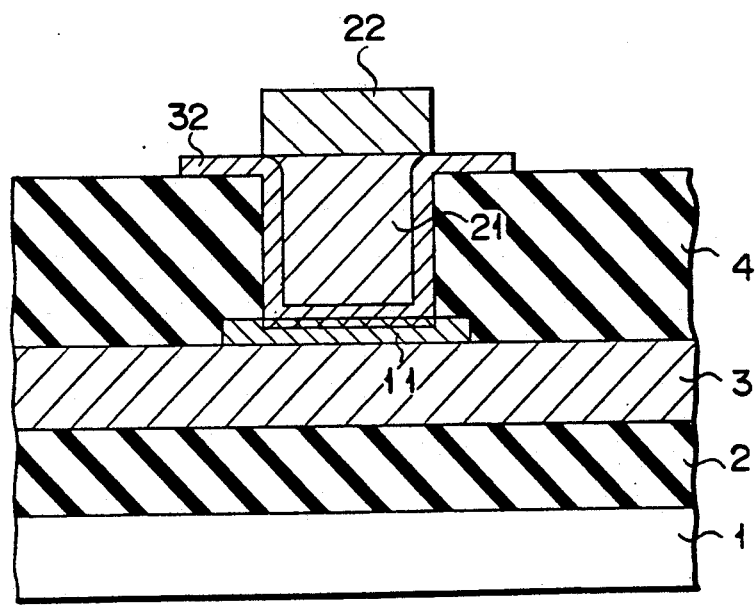
F I G. 7

SEMICONDUCTOR DEVICE HAVING MULTI-LAYERED WIRING, AND METHOD OF MANUFACTURING THE SAME

BACKGROUND OF THE INVENTION

1. Field of the Invention

The present invention relates to a semiconductor device and a method of manufacturing the device, and more particularly to a semiconductor device having an upper wiring layer and a lower wiring layer and a method of forming these wiring layers.

2. Description of the Related Art

A semiconductor device is known which has an upper wiring layer and a lower wiring layer. These wiring layers are connected, forming a VIA contact, by a specific method. This method will be explained with reference to FIGS. 1A to 1C.

First, as is shown in FIG. 1A, a first inter-layer insulation film 2 is deposited on a semiconductor substrate 1 in which various elements have been formed. Next, a first wiring layer 3 (e.g., an Al-alloy layer) is formed on the first inter-layer insulation film 2. A second inter-layer insulation film 4 (e.g., a plasma $SiO_2$ film) is deposited on the first wiring layer 3. A photoresist 5 is formed on the second inter-layer insulation film 4. The photoresist 5 has an opening formed in a predetermined portion. Then, as is shown in FIG. 1B, anisotropic etching (e.g., reactive ion etching) is performed on the second inter-layer insulation film 4, using the photoresist 5 as mask. As a result, a contact hole 6 is made in the film 4, thus exposing the first wiring layer 3. Further, as is shown in FIG. 1C, the photoresist 5 is removed, and a metal layer (e.g., an Al-alloy layer) is deposited on the surface of the resultant structure, by means of sputtering. The metal layer is patterned, by the known method, into a second wiring layer 7.

The method described above is disadvantageous in two respects. First, as carbon (C) and fluorine (F) are emitted from the photoresist 5 into the plasma during the anisotropic etching, the metals and impurities (C, Cl, F) contained in the fist wiring layer 3 are sputtered onto the periphery of the contact hole 6 made in the insulation film 4, thus forming a metal-containing organic film 8. Secondly, after the hole 6 is made, thus exposing the first wiring layer 3 to the atmosphere, the layer 3 and the chlorine (Cl) on the surface thereof react, thus forming aluminum chloride ($AlCl_4$), and then aluminum chloride and the water in the atmosphere react, thus forming chlorine ions, as can be understood from the following formulae:

$$Al + 4Cl^- \rightarrow AlCl_4^- + 3e \quad (1)$$

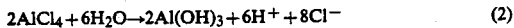

$$2AlCl_4 + 6H_2O \rightarrow 2Al(OH)_3 + 6H^+ + 8Cl^- \quad (2)$$

The more chlorine ions are formed, the more the first wiring layer 3 is corroded. Ultimately, a thick aluminum hydroxide film 9 is formed on the bottom of the contact hole 6, namely on the exposed portion of the first wiring layer 3.

The presence of the metal-containing organic film 8 and the aluminum hydroxide film 9 result in two undesirable phenomena. First, the second wiring layer 7 has overhangs, with the result that some of the wires, but not all, are cut. Second, the electrical connection between the first and second wiring layers 3 and 7 is inevitably impaired.

The conventional semiconductor, whose upper and lower wiring layers are formed by the method explained above, cannot have a sufficiently high integration density. This is because a relatively broad margin must be provided for the alignment between the masks for forming the upper wiring layer 7 and the contact hole 6.

SUMMARY OF THE INVENTION

Accordingly it is an object of the invention to provide a semiconductor device which comprises upper and lower wiring layers, completely intact and reliable and reliably connected to each other.

It is another object of the invention to provide a method of manufacturing a semiconductor device, wherein no reaction product is formed when a contact hole is formed for connecting upper and lower wiring layers together, and no metal hydroxide is formed on the surface of the lower wiring layer after the contact hole has been formed.

According to one aspect of the invention, there is provided a semiconductor device comprising: a semiconductor substrate; a first metal wiring layer formed on the substrate; a conductive film formed on a predetermined portion of the first metal wiring layer; an inter-layer insulation film formed on the first metal wiring layer and the conductive film; a contact hole made in the inter-layer insulation film and having a diameter smaller than the conductive film; and a second metal wiring layer formed connected to the conductive film by virtue of the contact hole.

According to another aspect of the invention, there is provided a method of manufacturing a semiconductor device, comprising the steps of: forming a first metal layer on a semiconductor substrate; depositing a conductive film on the first metal wiring layer; etching the conductive film, except for a selected portion; depositing an inter-layer insulation film on the first metal wiring layer and the remaining conductive film; forming a contact hole in the inter-layer insulation film by means of etching, said contact hole being smaller than the remaining conductive layer; depositing metal on the surface of the inter-layer insulation film and in the contact hole, thus forming a metal layer; and patterning the metal layer, thereby forming a second metal wiring layer connected to the remaining conductive layer by virtue of the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are sectional views, explaining a conventional method of manufacturing a semiconductor device;

FIG. 4 is a sectional view, explaining one of the steps of a method of manufacturing a semiconductor device according to a second embodiment of the present invention;

FIGS. 5A to 5C are sectional views, explaining a method of manufacturing a semiconductor device according to a third embodiment of this invention;

FIG. 6 is a plan view showing the semiconductor device according to the third embodiment of the invention; and FIG. 7 is a sectional view, explaining one of the steps of a method of manufacturing a semiconductor device according to a fourth embodiment of the present invention.

DETAILED DESCRIPTION OF THE PREFERRED EMBODIMENTS

Embodiments of the present invention will now be described in detail, with reference to the accompanying drawings.

A method of manufacturing a semiconductor device according to a first embodiment of the present invention, will be described, with reference to FIGS. 2A to 2E.

Figure 2A:
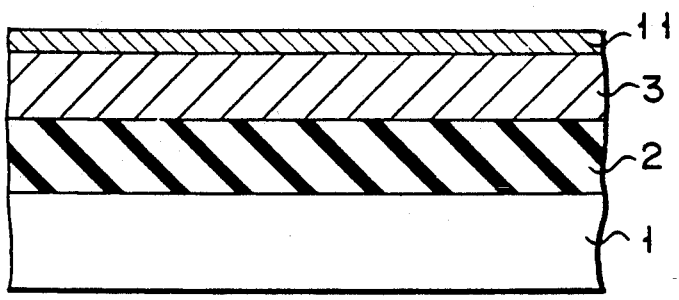
FIGS. 2A to 2E are sectional views, explaining a method of manufacturing a semiconductor device according a first embodiment of the invention.

First, as is shown in FIG. 2A, a first inter-layer insulation film 2 is deposited on a semiconductor substrate 1 having various elements (not shown) formed in it. An Al-alloy (Al-98.5%, Si-1%, Cu-0.5%) is deposited by sputtering on the first inter-layer insulation film 2, thereby forming an Al-alloy film having a thickness of about 800 nm. The Al-alloy film is patterned by means of PEP and RIE, whereby a first metal wiring layer 3 is formed. Next, a conductive film 11 made of doped polysilicon and having a thickness of 50 to 100 nm is deposited on the first metal wiring layer 3 by means of low-temperature plasma chemical vapor deposition (CVD), wherein $SiH_4$ gas and doping gas, such as $PH_3$ or $B_2H_6$, are applied to the first metal wiring layer 3.

Figure 2B:
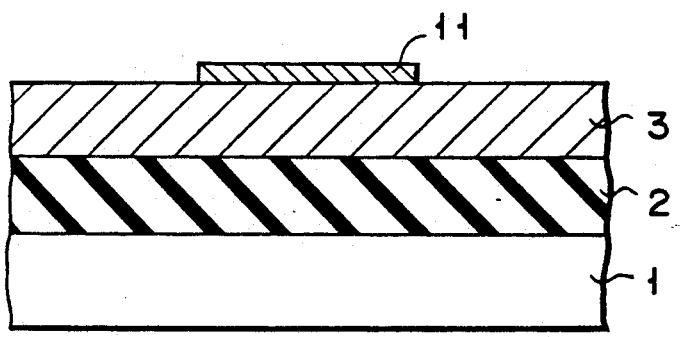

Then, PEP and RIE are performed by using a mask (not shown) having a predetermined pattern, thereby etching the conductive film 11, except that portion located on a selected portion of the metal wiring layer 3, as is illustrated in FIG. 2B.

Figure 2C:
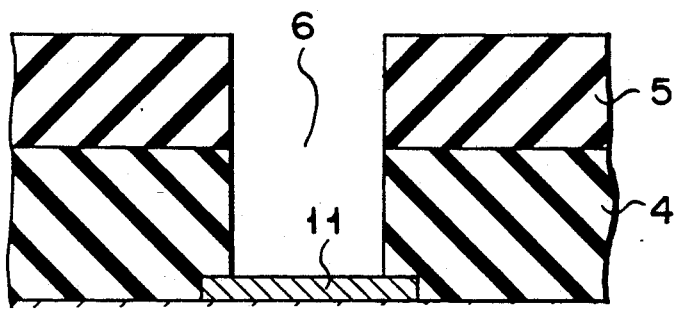

As is shown in FIG. 2C, a second inter-layer insulation film 4 made of $SiO_2$ and having a thickness of 1 to 1.5 μm is deposited on the layer 3 and the film 11, by means of a low-temperature plasma CVD apparatus. Further, PEP and RIE were carried out by using a photo resist mask 5 having a specific pattern, thereby forming in the insulation film 4 a contact hole 6 which is smaller than the conductive film 11. As a result, a portion of the conductive film 11 is exposed as is illustrated in FIG. 2C.

Figure 2D:
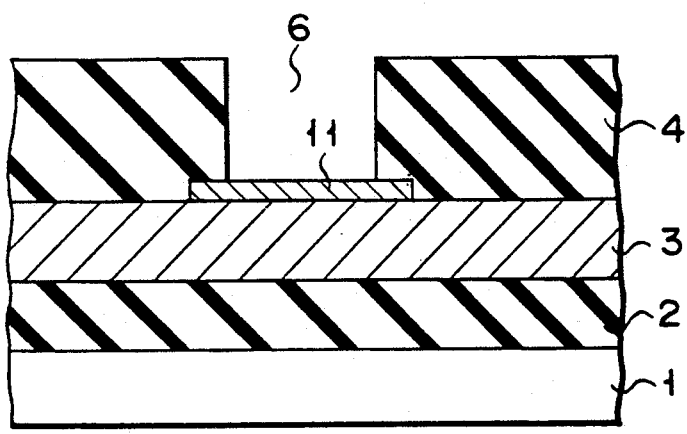

Next, as is shown in FIG. 2D, the photoresist mask 5 is removed.

Figure 2E:
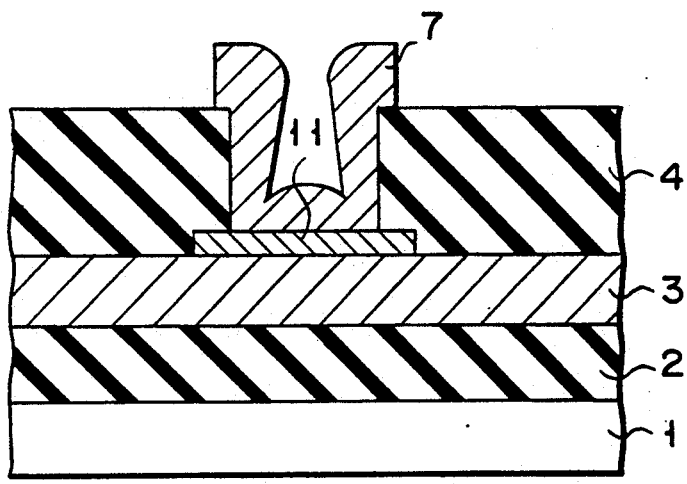

Thereafter, a layer of Al-alloy (Al-98.5%, Si-1%, Cu-0.5%), having a thickness of about 1 μm, is deposited on the conductive film 11 (i.e., the polysilicon film). PEP and RIE are performed on the Al-alloy layer, thus formed, patterning the same into a second metal wiring layer 7 having a desired shape, as is illustrated in FIG. 2E.

Figure 3:
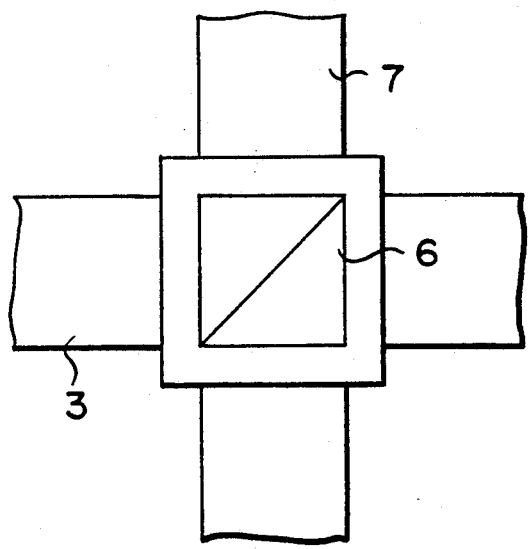
FIG. 3 is a plan view illustrating the semiconductor device according to the first embodiment of the invention.

FIG. 3 is a plan view illustrating how the first and second metal wiring layers 3 and 7 are positioned with respect to each other.

In the method described above, no part of the first metal wiring layer 3 is exposed during the RIE for forming the contact hole 6, by virtue of the presence of the conductive film 11 formed on the first metal wiring layer 3. The metals or the impurities (C, Cl, F) contained in the layer 3 are not sputtered at all onto the periphery of the contact hole 6 formed in the insulation film 4. Hence, the second wiring layer 7 has no overhangs, is intact and is reliable.

Moreover, even if water in the atmosphere enters the contact hole 6 after the hole 6 has been formed in the insulation film 4, no aluminum hydroxide is formed on the first metal wiring layer 3 by virtue of the presence of the conductive film 11 formed on the first metal wiring layer 3. This ensures the electrical connection between the first and second wiring layers 3 and 7.

A method of manufacturing a semiconductor device, according to a second embodiment, will next be described. This method is identical to the above-explained method for manufacturing the device according to the first embodiment of the invention, except that after the contact hole 6 has been formed in the second insulation film 4, a layer 21 of tungsten, which has a high melting point, is formed in the hole 6 by means of CVD method, as shown in FIG. 4. After the tungsten layer 21 has been formed in the contact hole 6, a layer of Al-alloy (Al-98.5%, Si-1%, Cu-0.5%), having a thickness of about 1 μm, is deposited, partly on the insulation film 4 and partly on the tungsten layer 21. Further, PEP and RIE are performed on the Al-alloy layer, patterning the same into a second metal wiring layer 22 having a desired shape, as illustrated in FIG. 4.

In the method of manufacturing the semiconductor device according the second embodiment, the conductive film 11, formed on the first metal wiring layer 3, promotes the growth of the tungsten layer 21.

In the semiconductor devices according to the first and second embodiments, the conductive film 11 can be made of silicide of a metal having a high melting point, instead of doped polysilicon.

A method of manufacturing a semiconductor device, according to a third embodiment, will be described, with reference to FIGS. 5A to 5C.

First, as is shown in FIG. 5A, a first inter-layer insulation film 2 is deposited on a semiconductor substrate 1 in the same way as in the method of manufacturing the semiconductor device of the first embodiment. Then, a first metal wiring layer 3 is formed on the first insulation film 2. A conductive film made of polysilicon is deposited on the first metal wiring layer 3. Selective etching is performed on the conductive film, patterning the same into a first conductive film 11. A second interlayer insulation film 4 is deposited, partly on the first metal wiring layer 3 and partly on the first conductive film 11. A contact hole 6 smaller than the first conductive film 11 is made in the second insulation film 4. Next, as is shown in FIG. 5A, a layer 31 having a thickness of 50 to 100 nm, made of titanium, a metal having a high melting point, is formed by a metal-sputtering apparatus in the hole 6 and on the insulation film 4. The layer 31 can be made of other metal having a high melting point, such as tungsten (W), molybdenum (Mo), or tantalum (Ta).

The resultant structure is heated in vacuum at a temperature higher than 300° C., whereby the first conductive film 11 (polysilicon) and the titanium layer 31 react with each other, forming a $TiSi_x$ (e.g., $TiSi_2$) film 31, not only on the first conductive film 11 and the periphery of the hole 6, but also on that portion of the insulation film 4 which surrounds the opening of the hole 6. That portion of the titanium layer 31 which has not reacted with the polysilicon of the first conductive film 11 is removed by means of etching wherein an HF-based etchant is used. As a result, as is shown in FIG. 5B, only the $TiSi_x$ film 32 is left intact, which is aligned with the first conductive film 11 and serves as second conductive film.

Thereafter, a layer of Al-alloy (Al-98.5%, Si-1%, Cu-0.5%), having a thickness of about 1 μm, is deposited on the second conductive film 32 and on the second insulation film 4. PEP and RIE are performed on the Al-alloy layer, thus formed, patterning the same into a second metal wiring layer 7 having a desired shape, as illustrated in FIG. 5C.

The first metal wiring layer 3 and the second metal wiring layer 7 of the semiconductor device (FIG. 5C) have the positional relationship shown in FIG. 6.

The semiconductor device according to the third embodiment, thus manufactured, has the same advantages as the devices of the first and second embodiments. In addition, this device can have a higher integration density since the second conductive film 32 is self-aligned with respect to the first conductive film 11, making it unnecessary to provide a broad alignment margin between the first and second metal wiring layers 3 and 7.

A method of manufacturing a semiconductor device according to a fourth embodiment of the invention will now be explained. Steps identical to those explained with reference to FIGS. 5A and 5B are carried out, thereby forming the structure shown in FIG. 5B. Then, as is shown in FIG. 7, a layer 21 of metal having a high melting point, such as tungsten, is formed in the contact hole 6 by means of CVD method. Next, a layer of Al-alloy (Al-98.5%, Si-1%, Cu-0.5%), having a thickness of about 1 μm, is deposited by sputtering on the layer 21, the second conductive film 32, and the second insulation film 4. PEP and RIE are performed on the Al-alloy layer, thus formed, patterning the same into a second metal wiring layer 22 having a desired shape.

In the method of forming the device according to the fourth embodiment, too, the conducive film 11 formed on the first metal wiring layer 3 promotes the growth of the tungsten layer 21 as in the method of manufacturing the device according to the second embodiment of the invention.

As has been described, the present invention can provide a semiconductor device which comprises upper and lower wiring layers, completely intact and reliable and reliably connected to each other, and which can have a high integration density.

Moreover, the invention can provide a method of manufacturing a semiconductor device, wherein no reaction product is formed when a contact hole is formed for connecting upper and lower wiring layers together, and no metal hydroxide is formed on the surface of the lower wiring layer after the contact hole has been formed. readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first metal wiring layer made of Al alloy and formed on said substrate;
   a conductive film made of one material selected from the group consisting of polysilicon and silicide of metal having a high melting point, said conductive film being formed on a predetermined portion of said first metal wiring layer;
   an inter-layer insulating film formed on said first metal wiring layer and said conductive film;
   a contact hole formed in said inter-layer insulation film and having a diameter smaller than said conductive film;
   a second metal wiring layer made of metal having a high melting point, provided in said contact hole, and connected to said conductive film; and
   a third metal wiring layer made of Al alloy, formed on said second metal wiring layer, and electrically connected thereto.

2. A semiconductor device comparing:
   a semiconductor substrate;
   a first metal wiring layer made of Al alloy and formed on said semiconductor substrate;
   a conductive film made of one material selected from the group consisting of polysilicon and silicide of metal having a high melting point, said conductive film being formed on a predetermined portion of said first metal wiring layer;
   an inter-layer insulating film formed on said first metal wiring layer and said conductive film;
   a contact hole formed in said inter-layer insulation film and having a diameter smaller than said conductive film;
   a second metal wiring layer made of metal having a high-melting point and provided in a partial region within said contact hole;
   a third metal wiring layer made of metal having a high melting point and formed on said second metal wiring layer; and
   a fourth metal wiring layer made of Al alloy, formed on said third metal wiring layer, and electrically connected to said third metal wiring layer.

* * * * *